(12) United States Patent
Chen et al.

(10) Patent No.: US 10,886,172 B2
(45) Date of Patent: Jan. 5, 2021

(54) METHODS FOR WORDLINE SEPARATION IN 3D-NAND DEVICES

(71) Applicant: Applied Materials, Inc., Santa Clara, CA (US)

(72) Inventors: Yihong Chen, San Jose, CA (US); Ziqing Duan, San Jose, CA (US); Abhijit Basu Mallick, Palo Alto, CA (US); Kelvin Chan, San Ramon, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 16/848,754

(22) Filed: Apr. 14, 2020

(65) Prior Publication Data

US 2020/0243382 A1    Jul. 30, 2020

Related U.S. Application Data

(63) Continuation of application No. 16/505,699, filed on Jul. 8, 2019, now Pat. No. 10,622,251, which is a (Continued)

(51) Int. Cl.
*H01L 21/4763* (2006.01)
*H01L 21/768* (2006.01)
(Continued)

(52) U.S. Cl.
CPC .. *H01L 21/76877* (2013.01); *H01L 21/02175* (2013.01); *H01L 21/02244* (2013.01); *H01L 21/28568* (2013.01); *H01L 21/31122* (2013.01); *H01L 21/32135* (2013.01); *H01L 21/76843* (2013.01); *H01L 21/76888* (2013.01); *H01L 23/528* (2013.01); *H01L 23/53266* (2013.01);
(Continued)

(58) Field of Classification Search
CPC ......... H01L 21/76877; H01L 21/02244; H01L 21/28568
USPC ......................................... 438/643
See application file for complete search history.

(56) References Cited

U.S. PATENT DOCUMENTS 3,649,512 A    3/1972  Ackley
4,826,584 A    5/1989  Dos Santos Pereiro
(Continued)

FOREIGN PATENT DOCUMENTS

KR    20130066950 A    7/2016
TW      201737372 A   10/2017
(Continued)

OTHER PUBLICATIONS

Non-Final Office Action in U.S. Appl. No. 16/583,749 dated Apr. 21, 2020, 11 pages.
(Continued)

*Primary Examiner* — David S Blum
(74) *Attorney, Agent, or Firm* — Servilla Whitney LLC

(57) ABSTRACT

Methods of wordline separation in semiconductor devices (e.g., 3D-NAND) are described. A metal film is deposited in the wordlines and on the surface of a stack of spaced oxide layers. The metal film is removed by high temperature oxidation and etching of the oxide or low temperature atomic layer etching by oxidizing the surface and etching the oxide in a monolayer fashion. After removal of the metal overburden, the wordlines are filled with the metal film.

20 Claims, 3 Drawing Sheets

US 10,886,172 B2
Page 2

Related U.S. Application Data continuation of application No. 15/986,189, filed on May 22, 2018, now Pat. No. 10,354,916.

(60) Provisional application No. 62/513,371, filed on May 31, 2017.

(51) Int. Cl.
| | |
|---|---|
| *H01L 21/3213* | (2006.01) |
| *H01L 21/02* | (2006.01) |
| *H01L 27/11582* | (2017.01) |
| *H01L 27/11556* | (2017.01) |
| *H01L 21/285* | (2006.01) |
| *H01L 23/532* | (2006.01) |
| *H01L 21/311* | (2006.01) |
| *H01L 23/528* | (2006.01) |

(52) U.S. Cl.
CPC .. *H01L 27/11556* (2013.01); *H01L 27/11582* (2013.01)

(56) References Cited

U.S. PATENT DOCUMENTS

| | | | |
|---|---|---|---|
| 6,113,754 A | 9/2000 | Oh et al. | |
| 6,235,632 B1 | 5/2001 | Nogami et al. | |
| 6,840,427 B2 | 1/2005 | Ivanov | |
| 8,865,594 B2 | 10/2014 | Lee et al. | |
| 8,912,591 B2 | 12/2014 | Baek et al. | |
| 9,972,504 B2 | 5/2018 | Lai et al. | |
| 10,354,916 B2 | 6/2019 | Chen et al. | |
| 2002/0100680 A1 | 8/2002 | Yamamoto et al. | |
| 2006/0260936 A1 | 11/2006 | Hort et al. | |
| 2010/0276743 A1 | 11/2010 | Kuniya et al. | |
| 2011/0084320 A1 | 4/2011 | Jung | |
| 2011/0169067 A1 | 7/2011 | Ernst et al. | |
| 2012/0051137 A1 | 3/2012 | Hung et al. | |
| 2013/0049095 A1 | 2/2013 | Whang et al. | |
| 2013/0069135 A1 | 3/2013 | Nakahara et al. | |
| 2014/0061039 A1 | 3/2014 | Riker et al. | |
| 2016/0343718 A1 | 11/2016 | Lu et al. | |
| 2018/0211826 A1 | 7/2018 | Wang et al. | |
| 2019/0273019 A1 | 9/2019 | Mullick et al. | |

FOREIGN PATENT DOCUMENTS

| | | |
|---|---|---|
| WO | 2007024428 A2 | 3/2007 |
| WO | 2017/083113 A1 | 5/2017 |

OTHER PUBLICATIONS

PCT International Search Report and Written Opinion in PCT/US2018/013802 dated Jun. 27, 2018, 15 pages.

PCT International Search Report and Written Opinion in PCT/US2018/033893 dated Sep. 12, 2018, 9 pages.

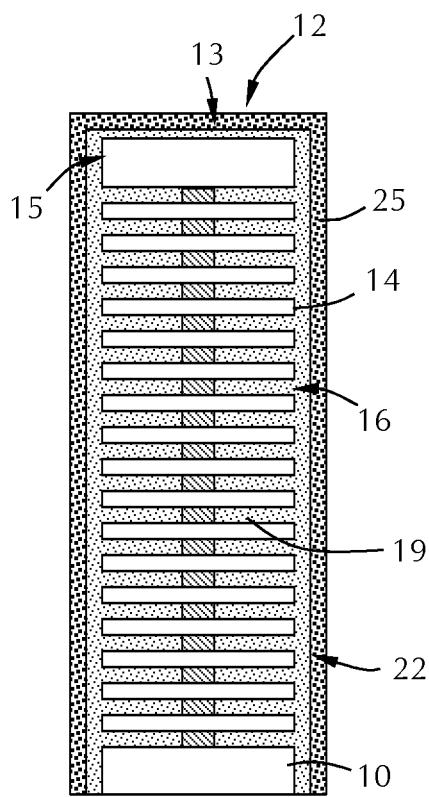
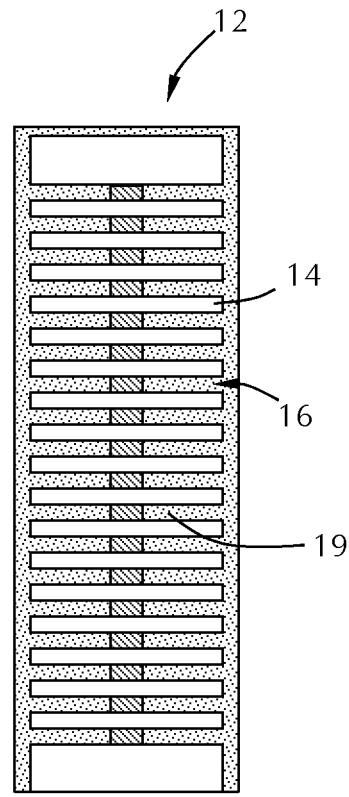
FIG. 4A    FIG. 4B
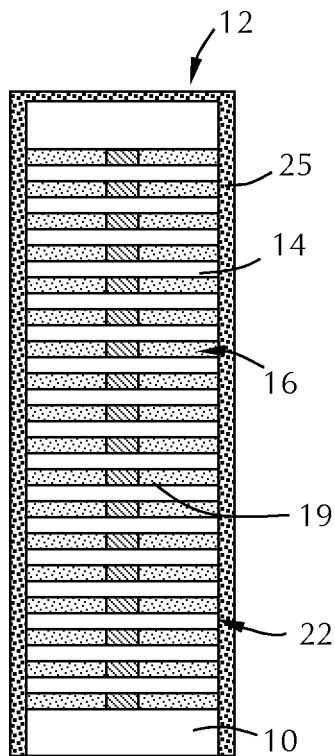
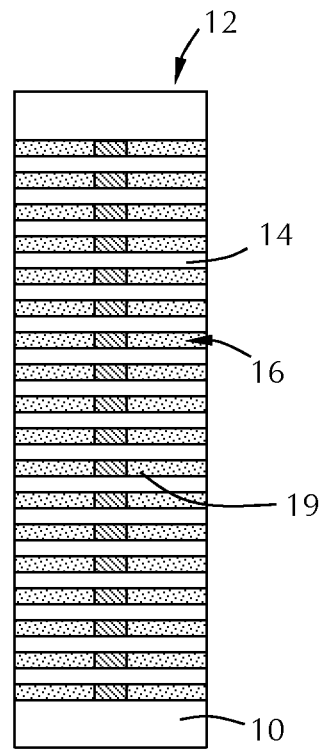
FIG. 4C    FIG. 4D

METHODS FOR WORDLINE SEPARATION IN 3D-NAND DEVICES

CROSS-REFERENCE TO RELATED APPLICATIONS

This application is a continuation of U.S. patent application Ser. No. 16/505,699, now U.S. Pat. No. 10,622,251, filed Jul. 8, 2019, which is a continuation of U.S. patent application Ser. No. 15/988,189, now U.S. Pat. No. 10,354,916, filed May 22, 2018, which claims priority to U.S. Provisional Application No. 62/513,371, filed May 31, 2017, the entire disclosure of which is hereby incorporated by reference herein.

TECHNICAL FIELD

Embodiments of the disclosure generally relate to methods of filling a gap or feature in a semiconductor device. More specifically, embodiments of the disclosure relate to methods of gap fill in three dimensional semiconductor devices using tungsten.

BACKGROUND

Semiconductor and electronics processing industries continue to strive for larger production yields while increasing the uniformity of layers deposited on substrates having larger surface areas. These same factors in combination with new materials also provide higher integration of circuits per area of the substrate. As circuit integration increases, the need for greater uniformity and process control regarding layer thickness rises. As a result, various technologies have been developed to deposit layers on substrates in a cost-effective manner, while maintaining control over the characteristics of the layer.

V-NAND, or 3D-NAND, structures used in flash memory applications. V-NAND devices are vertically stacked NAND structures with a large number of cells arranged in blocks. Gate-last wordline formation is currently the mainstream process flow in 3D-NAND manufacturing. Prior to wordline formation, the substrate is a layered oxide stack supported by a memory string. The gap space is filled by tungsten using CVD or ALD. The top/sidewall of the memory stack is also coated with tungsten. The tungsten is removed from the top/sidewall of the stack by etch process (e.g., a reactive-ion etch (RIE) process or radical-based etch process) so that the tungsten exists only inside of the gap space and each tungsten fill is completely separated from other tungsten fills. However, due to the loading effect of the etch process, the separation etch often results in different wordline recess from at the top of the stack than at the bottom. This difference becomes more pronounced with increasing oxide stack layers.

Therefore, there is a need in the art for methods for wordline separation in three-dimensional structured devices.

SUMMARY

One or more embodiments of the disclosure are directed to methods of processing a substrate. A substrate having a stack of spaced oxide layers with gaps between the oxide layers is provided. The stack has a top and sides and each gap can form a wordline. A metal is deposited on the stack so that the metal fills the gaps and covers the top and sides of the stack with a thickness of metal overburden. The metal is oxidized to a depth about the thickness of the overburden to form a metal oxide on the top and sides of the stack and leaving the metal in the gaps as wordlines. The metal oxide is etched from the top and sides of the stack leaving the metal in the wordlines.

Additional embodiments of the disclosure are directed to methods of processing a substrate. A substrate having a stack of spaced oxide layers with gaps between the oxide layers is provided. The stack has a top and sides and each gap can form a wordline. A metal is deposited on the stack so that the metal fills the gaps and covers the top and sides of the stack with a thickness of metal overburden. A surface of the metal is repeatedly oxidized to form a metal oxide and the metal oxide is etched from the stack until the metal overburden is removed, leaving the metal in the gaps as wordlines.

Further embodiments of the disclosure are directed to methods of processing a substrate. A substrate having a stack of spaced oxide layers with gaps between the oxide layers is provided. The stack has a top and sides and each gap can form a wordline. A barrier layer is optionally formed on the spaced oxide layers. The barrier layer comprises TiN with a thickness in the range of about 20 Å to about 50 Å. Tungsten is deposited on the stack so that the tungsten fills the gaps and covers the top and sides of the stack with a thickness of tungsten overburden. The surface of the tungsten is repeatedly oxidized to form a tungsten oxide and etched to remove the tungsten overburden. The tungsten in the gaps is left substantially even with the sides of the stack. Oxidizing the surface comprises exposure to $O_2$ and etching the tungsten oxide comprising exposure to one or more of $WCl_5$ or $WCl_6$. The tungsten deposition, oxidizing the tungsten and etching the tungsten oxide occur at a temperature less than or equal to about 400° C.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. The appended drawings illustrate only typical embodiments of this disclosure and are therefore not to be considered limiting, for the disclosure may admit to other equally effective embodiments.

FIGS. 4A through 4D illustrate a low temperature oxidation and etching process in accordance with one or more embodiment of the disclosure.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

One or more embodiments of the disclosure advantageously provide methods of depositing a tungsten film in the gaps of a three-dimensional structure. Some embodiments of the disclosure advantageously provide methods of depositing conformal tungsten oxide films and selective tungsten oxide removal. Some embodiments advantageously provide methods to fill lateral features of a V-NAND with high quality tungsten films with uniform thickness from top to bottom of the oxide stack.

One or more embodiments of the disclosure are directed to methods for wordline separation based on highly conformal metal (e.g., tungsten) oxidation and highly selective metal oxide (e.g., tungsten oxide) removal. The methods can use high temperature or low temperature processes.

Figure 1:
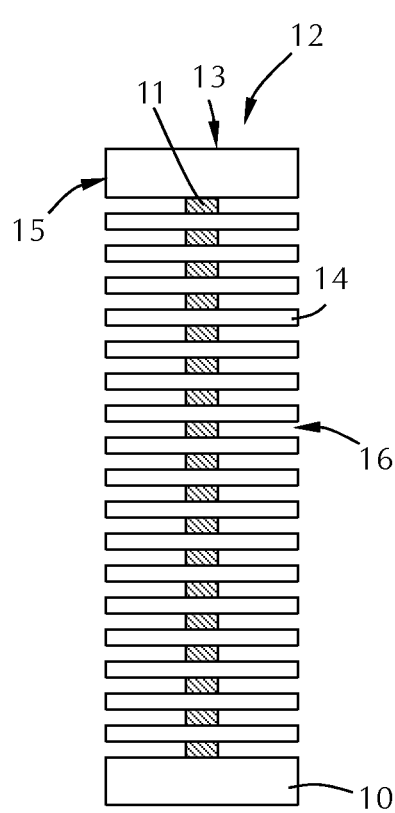
FIG. 1 illustrates a stack of oxide layers in which wordlines will be formed in accordance with one or more embodiment of the disclosure.

Referring to FIG. 1, a substrate 10 has a stack 12 of layers thereon. The substrate 10 can be any suitable substrate material and is not limited to being the same material as any of the individual layers. For example, in some embodiments, the substrate is an oxide, nitride or metal layer. The stack 12 has a plurality of oxide layers 14 that are spaced apart from each other to form gaps 16 between the oxide layers 14 so that each gap forms a wordline or shell for a wordline to be formed. The stack 12 has a top 13 and sides 15.

The stack 12 can have any suitable number of oxide layers 14 or gaps 16. In some embodiments, there are greater than or equal to about 10, 20, 30, 40, 50, 60, 70, 80, 90 or 100 gaps 16 formed in the stack 12 that can be used to form an equal number of wordlines. The number of the gaps 16 is measured on either side of the memory string 11 that connects all of the individual oxide layers 14. In some embodiments, the number of gaps 16 is a multiple of 2. In some embodiments, the number of gaps is equal to $2^n$ where n is any positive integer. In some embodiments, the number of gaps 16 is about 96.

Figure 2:
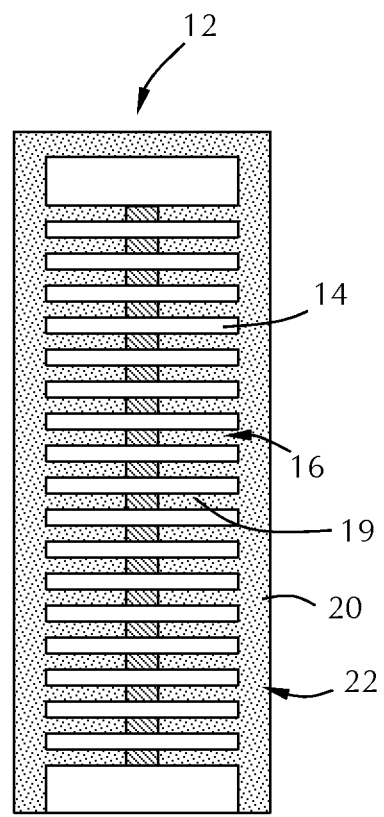
FIG. 2 illustrates a metal film formed on the stack of oxide layers of FIG. 1.

A metal 20 is deposited on the stack 12, as illustrated in FIG. 2. The metal 20 fills the gaps 16 to form wordlines 19. The metal 20 forms is formed all around the stack 12 so that the metal 20 covers the top 13 and sides 15 of the stack 12 with a thickness of metal overburden 22. The overburden 22 is the material that is deposited outside of the gaps 16. The overburden can by any suitable thickness depending on the process used to deposit the metal 20. In some embodiments, the overburden 22 has a thickness in the range of about 1 Å to about 1000 Å. In some embodiments, the overburden 22 has a thickness greater than or equal to about 5 Å, 10 Å, 15 Å, 20 Å, 25 Å, 30 Å, 35 Å, 40 Å, 45 Å or 50 Å.

The metal 20 can be any suitable metal used in wordline applications. In some specific embodiments, the metal film comprises tungsten. In some specific embodiments, the metal film excludes tungsten. In some specific embodiments, the metal film consists essentially of tungsten. As used in this regard, the term "consists essentially of tungsten" means that the composition of the bulk metal film is greater than or equal to about 95%, 98% or 99% tungsten on an atomic basis. The bulk metal film excludes the surface portions of the metal 20 that might contact another surface (e.g., the oxide surface) or is open for further processing as these areas may have some small amount of atomic diffusion with the adjacent material or have some surface moiety like a hydride termination.

The metal 20 can be deposited by any suitable technique including, but not limited to, chemical vapor deposition (CVD) or atomic layer deposition (ALD). The metal 20 is deposited inside the gap space and at the top/sidewall of the memory stack.

Figure 3A:
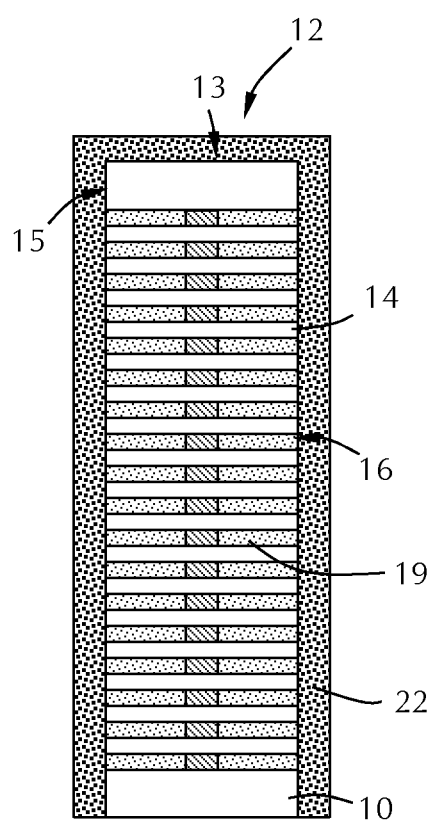
FIGS. 3A and 3B illustrate a high temperature oxidation and etching process in accordance with one or more embodiment of the disclosure.
Figure 3B:
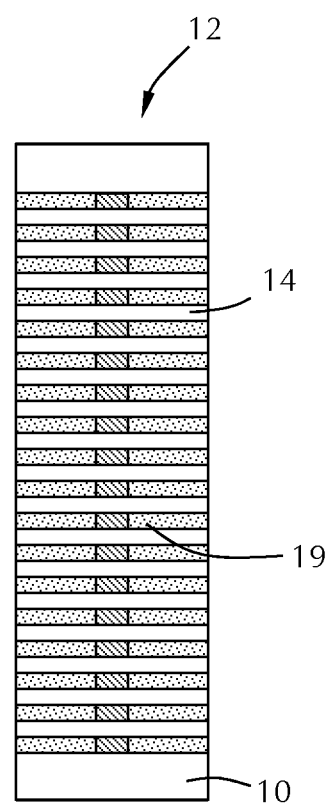

Referring to FIGS. 3A and 3B, a high temperature oxidation with low temperature etch process is illustrated. In FIG. 3A, the metal 20 is oxidized to a metal oxide 25 to a depth about the thickness of the overburden 22. Substantially all of the overburden 22 can be oxidized in a one-step oxidation process. The oxidation of the overburden can be affected by, for example, oxidizing gas flow, oxidizing gas partial pressure, wafer temperature, and process time to form a highly conformal oxidation of the metal overburden 22.

The oxidizing gas can be any suitable oxidizing gas that can react with the metal 20 that has been deposited. Suitable oxidizing gases include, but are not limited to $O_2$, $O_3$, $H_2O$, $H_2O_2$, NO, $NO_2$ or combinations thereof. In some embodiments, the oxidizing gas comprises one or more of $O_2$ or $O_3$. In some embodiments, the oxidizing gas consists essentially of one or more of $O_2$ or $O_3$. As used in this manner, the term "consists essentially of" means that the oxidizing component of the oxidizing gas is greater than or equal to about 95%, 98% or 99% of the stated species. The oxidizing gas can include an inert, diluent or carrier gas. For example, the oxidizing gas can be co-flowed with or diluted in one or more of Ar, He or $N_2$.

The metal oxide 25 of some embodiments comprises tungsten oxide ($WO_x$). In some embodiments, the metal oxide 25 is a derivative of the metal 20 that may or may not include oxygen. Suitable derivatives of the metal film include, but are not limited to, nitride, boride, carbide, oxynitride, oxyboride, oxycarbide, carbonitride, borocarbide, boronitride, borocarbonitride, borooxycarbonitride, oxycarbonitride, borooxycarbide and borooxynitride. Those skilled in the art will understand that the metal film deposited may have a non-stoichiometric amount of atoms with the metal film. For example, a film designated as WO may have different amounts of tungsten and oxygen. The WO film may be, for example, 90 atomic % tungsten. The use of WO to describe a tungsten oxide film means that the film comprises tungsten and oxygen atoms and should not be taken as limiting the film to a specific composition. In some embodiments, the film consists essentially of the designated atoms. For example, a film consisting essentially of WO means that the composition of the film is greater than or equal to about 95%, 98% or 99% tungsten and oxygen atoms.

In the process illustrated by FIGS. 3A and 3B, the oxidation process occurs at high temperature. As used in this regard, the term "high temperature" means a temperature greater than or equal to about 400° C., 450° C., 500° C., 550° C., 600° C., 650° C., 700° C., 750° C., 800° C. or 850° C.

In some embodiments, the temperature of the oxidation process is in the range of about 400° C. to about 950° C., or in the range of about 450° C. to about 900° C., or in the range of about 500° C. to about 850° C.

The pressure during the oxidation process can be in the range of about 0.1 Torr to about 760 Torr. The process time (exposure time) can be in the range of about 0.1 seconds to 12 hours. The pressure and process time can be affected by the temperature during the oxidation process.

In some embodiments, the metal 20 of the overburden 22 is oxidized to form a metal oxide 25 on the top 13 and sides 15 of the stack 12 while leaving the metal 20 in the gaps 16 to form the wordlines 19. In some embodiments, substantially all of the metal 20 in the gap 16 remains after oxidation. As used in this manner, the term "substantially all" means that the metal 20 is oxidized to within ±1 Å of the side 15 of the stack 12.

Referring to FIG. 3B, the metal oxide 25 formed from the overburden 22 is etched from the top 13 and sides 15 of the stack 12 to leave the metal 20 in the gaps 14 as wordlines 19. The etch process of some embodiments is a selective etch process that will remove the metal oxide 25 without substantially affecting the metal 20.

In some embodiments, the etchant comprises a metal halide etchant. The etchant of some embodiments consists essentially of a metal halide etchant. As used in this regard, the term "consists essentially of a metal halide etchant" means that the specified metal halide etchant species makes up 95%, 98% or 99% (not including inert, diluent or carrier gas) of the total metal halide etchant species. The metal halide etchant can have the same metal species as the metal oxide 25 or a different metal species. In some embodiments, the metal halide etchant comprises the same metal species as the metal oxide 25.

In some embodiments, the metal halide etchant comprises halogen atoms consisting essentially of chlorine. As used in this regard, the term "consisting essentially of chlorine" means that chlorine makes up greater than or equal to about 95%, 98% or 99% of the halogen atoms in the metal halide etchant on an atomic basis.

In some embodiments, the metal halide etchant comprises one or more of $WCl_5$ or $WCl_6$. In some embodiments, the metal halide etchant consists essentially of one or more of $WCl_5$ or $WCl_6$. As used in this regard, the term "consists essentially of" means that the stated species make up greater than or equal to about 95%, 98% or 99% of the metal halide on a molar basis.

The etch temperature of some embodiments is lower than the temperature during oxidation. In some embodiments, the etch temperature is in the range of about 300° C. to about 600° C., or in the range of about 400° C. to about 500° C. In some embodiments, the etch temperature is less than or equal to about 600° C., 550° C., 500° C., 450° C., 400° C. or 350° C. In some embodiments, the temperature during etching is greater than or equal to about 50° C., 75° C., 100° C., 125° C. or 150° C. lower than the temperature during oxidation. In some embodiments, both oxidation and etching occur at a temperature greater than or equal to about 400° C.

After etching the metal oxide 25, the metal overburden 22 is removed and the metal 20 remaining in the gaps 14 as wordlines 19 is substantially even with the sides 15 of the stack 12. As used in this manner, the term "substantially even" means that the wordlines 19 within gaps 16 are within ±1 Å of the side 15 of the stack 12.

The embodiment illustrated in FIGS. 3A and 3B show a high temperature oxidation—low temperature etch process. The embodiment illustrated in FIGS. 4A through 4D show a low temperature oxidation and etch process. Some differences between the processes include, but are not limited to, lower temperature oxidation and slower removal of the overburden.

After the stack 12 has the metal 20 with overburden 22 formed (as in FIG. 2), the removal of the overburden can be performed by an atomic layer etching type process. An atomic layer etch process can include multiple repeating processes that modify a surface to be etched and then volatilize or remove the modified surface, exposing a new surface below.

Referring to FIG. 4A, the overburden 22 is oxidized to form a metal oxide 25 on the surface of the overburden 22. The oxidation process can use the same reagents and parameters as the embodiment illustrated in FIG. 3A with some changes to allow an atomic layer etch (ALE) process to occur. The oxidation process of some embodiments occurs at a temperature in the range of about 300° C. to about 500° C. In some embodiments, the oxidation occurs at a temperature less than or equal to about 500° C., 450° C., 400° C. or 350° C. The pressure during the low temperature oxidation process can be in the range of about 0.1 Torr to about 760 Torr. The process or exposure time can be in the range of about 0.001 second to about 60 seconds. In the atomic layer etch process, each oxidation and etching process is self-limiting in that once the active surface sites have been reacted with, the process stops. For example, once all of the active surface sites of the metal 20 are exposed to and reacted with the oxidizing agent to form the metal oxide 25 film, no further oxidation can readily occur. Similarly, once the etchant has removed the oxide film to expose the fresh metal 20 below, the etchant has no further oxide to remove.

Referring to FIG. 4B, after formation of the metal oxide 25 on the metal 20, the stack 12 is exposed to an etchant. The etchant and etch conditions can be the same as those illustrated and described with respect to FIG. 3B. The metal oxide 25 layer on the metal 20 is thinner than the embodiment illustrated in FIGS. 3A and 3B so the etching process will take less time. In some embodiments, the etchant process time is in the range of about 0.1 second to about 60 seconds.

In some embodiments, the temperature during the oxidation and etching processes occur at a temperature less than or equal to about 400° C. The temperature of the etch process shown in FIG. 4B can be the same as the oxidation process of FIG. 4A so that the substrate containing the stack 12 can be rapidly moved from one process region of a processing chamber to another process region of the processing chamber to sequentially expose the substrate to the oxidation and etch conditions.

This type of ALE process may be referred to as a spatial ALE where the various reactive gases (e.g., oxidant and etchant) are flowed into separate regions of a processing chamber and the substrate is moved between and among the regions. The different process regions are separated by a gas curtain comprising one or more of purge gas streams and/or vacuum streams to prevent mixing of the oxidant and etchant in the gas phase. The ALE process can also be performed by a time-domain process where the processing chamber is filled with the oxidant, purged to remove the excess oxidant and reaction products or by-products, filled with the etchant and then purged to remove excess etchant and reaction products or by-products. In the time-domain process, the substrate can remain stationary.

FIGS. 4C and 4D show a repetition of the exposure to the oxidant to form the metal oxide 25 and etchant to remove the metal oxide, respectively. While the process is illustrated as using two cycles, those skilled in the art will understand that this is merely a representation and that more than two cycles may be used to remove the overburden 22 and leave the metal 20 in the gaps 16 as wordlines 19.

In some embodiments, a barrier layer is formed on the oxide layers 14 prior to deposition of the metal 20. The barrier layer can be any suitable barrier material. In some embodiments, the barrier layer comprises titanium nitride. In some embodiments, the barrier layer consists essentially of titanium nitride. As used in this manner, the term "consists essentially of titanium nitride" means that the composition of the barrier layer is greater than or equal to about 95%, 98% or 99% titanium and nitrogen atoms, on an atomic basis. The thickness of the barrier layer can be any suitable thickness. In some embodiments, the barrier layer has a thickness in the range of about 20 Å to about 50 Å.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A method of processing a substrate, the method comprising:
    filling the gaps between spaced oxide layers of a stack with a metal to cover a top and sides of the stack with a thickness of metal overburden;
    oxidizing the metal at an oxidizing temperature to form a metal oxide on the top and sides of the stack and leaving metal wordlines between the spaced oxide layers; and
    etching the metal oxide at an etching temperature from the top and sides of the stack leaving the metal wordlines between the spaced oxide layers, the etching temperature is greater than or equal to 50° C. lower than the oxidizing temperature.

2. The method of claim 1, wherein after etching, the wordlines are substantially even with the sides of the stack.

3. The method of claim 1, wherein the etching temperature is lower than the oxidizing temperature by greater than or equal to about 100° C.

4. The method of claim 3, wherein the etching temperature is lower than the oxidizing temperature by greater than or equal to about 150° C.

5. The method of claim 1, wherein the metal overburden has a thickness greater than or equal to about 5 Å.

6. The method of claim 5, wherein the metal overburden has a thickness greater than or equal to about 50 Å.

7. The method of claim 1, wherein oxidizing the metal comprises an oxidizing gas comprising one or more of $O_2$, $O_3$, $H_2O$, $H_2O_2$, NO or $NO_2$.

8. The method of claim 1, wherein the metal oxide comprises a derivative of the metal selected from one or more of a nitride, boride, carbide, oxynitride, oxyboride, oxycarbide, carbonitride, borocarbide, boronitride, borocarbonitride, borooxycarbonitride, oxycarbonitride, borooxycarbide or borooxynitride.

9. The method of claim 1, wherein the oxidation temperature is in the range of about 400° C. to about 950° C.

10. The method of claim 9, wherein the etching temperature is in the range of about 300° C. to about 600° C.

11. The method of claim 1, wherein the metal comprises tungsten and the metal oxide comprises tungsten oxide.

12. The method of claim 1, wherein the metal consists essentially of tungsten.

13. The method of claim 1, wherein prior to filling the gaps in the spaced oxide layers, the method further comprises forming a barrier layer on the spaced oxide layers and the metal is deposited on the barrier layer.

14. The method of claim 9, wherein the barrier layer comprises TiN with a thickness in the range of about 20 Å to about 50 Å.

15. The method of claim 1, wherein there are greater than 50 metal wordlines.

16. The method of claim 1, wherein etching the metal oxide comprises exposing the metal oxide to a metal halide etchant.

17. A method of processing a substrate, the method comprising:
    filling the gaps between spaced oxide layers of a stack with a metal to cover a top and sides of the stack with a thickness of metal overburden;
    oxidizing the metal at an oxidizing temperature to form a metal oxide on the top and sides of the stack and leaving metal wordlines between the spaced oxide layers that are substantially even with the sides of the stack, the oxidizing temperature in the range of about 400° C. to about 950° C.; and
    etching the metal oxide at an etching temperature from the top and sides of the stack leaving the metal wordlines between the spaced oxide layers, the etching temperature in the range of about 300° C. to about 600° C. and is at least 50° C. lower than the oxidizing temperature.

18. The method of claim 17, wherein prior to filling the gaps in the spaced oxide layers, the method further comprises forming a barrier layer on the spaced oxide layers and the metal is deposited on the barrier layer.

19. The method of claim 18, wherein the barrier layer comprises TiN with a thickness in the range of about 20 Å to about 50 Å.

20. A method of processing a substrate, the method comprising:
    forming a barrier layer on spaced oxide layers of a stack and gaps between the spaced oxide layers, the barrier layer comprising titanium nitride;
    depositing a metal on the barrier layer to fill the gaps and cover a top and sides of the stack with a thickness of metal overburden;
    oxidizing the metal at an oxidizing temperature to form a metal oxide on the top and sides of the stack and leaving metal wordlines between the spaced oxide layers that are substantially even with the sides of the stack; and
    etching the metal oxide at an etching temperature from the top and sides of the stack leaving the metal wordlines between the spaced oxide layers, the etching temperature at least 50° C. lower than the oxidizing temperature.

\* \* \* \* \*